(12) United States Patent
Ujihara et al.

(10) Patent No.: US 9,331,144 B2
(45) Date of Patent: May 3, 2016

(54) SEMICONDUCTOR DEVICE AND METHOD FOR PRODUCING THE SAME (71) Applicant: PS4 Luxco S.a.r.l., Luxembourg (LU)

(72) Inventors: Shingo Ujihara, Tokyo (JP); Koji Taniguchi, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 0 days.

(21) Appl. No.: 14/426,143

(22) PCT Filed: Sep. 3, 2013

(86) PCT No.: PCT/JP2013/074173
§ 371 (c)(1),
(2) Date: Mar. 4, 2015

(87) PCT Pub. No.: WO2014/038683
PCT Pub. Date: Mar. 13, 2014

(65) Prior Publication Data
US 2015/0270337 A1    Sep. 24, 2015

(30) Foreign Application Priority Data

Sep. 4, 2012  (JP) .................................. 2012-194020
Dec. 25, 2012 (JP) .................................. 2012-280891

(51) Int. Cl.
*H01L 29/00* (2006.01)
*H01L 29/06* (2006.01)
*H01L 27/108* (2006.01)
(Continued)

(52) U.S. Cl.
CPC ............ *H01L 29/0649* (2013.01); *H01L 21/76* (2013.01); *H01L 21/76224* (2013.01); *H01L 21/76229* (2013.01); *H01L 27/10894* (2013.01)

(58) Field of Classification Search
CPC ............. H01L 21/76229; H01L 21/76; H01L 21/76224; H01L 27/10894; H01L 29/0649
USPC .......... 257/500, 501, 510, 512, 513; 438/213, 438/221, 296, 309, 353, 427, 437
See application file for complete search history.

(56) References Cited

U.S. PATENT DOCUMENTS 6,642,125 B2 * 11/2003 Oh et al. ....................... 438/427
2002/0100953 A1  8/2002 Park
(Continued)

FOREIGN PATENT DOCUMENTS

CN    1356722 A    7/2002
CN    1359145 A    7/2002
(Continued)

OTHER PUBLICATIONS

International Search Report (ISR) (PCT Form PCT/ISA/210), in PCT/JP2013/074173, dated Nov. 26, 2013.

*Primary Examiner* — Hung Vu
(74) *Attorney, Agent, or Firm* — Kunzler Law Group (57) ABSTRACT

A semiconductor device includes, on one semiconductor substrate: a first element isolation region having a first width, wherein a liner oxide film, a liner nitride film and a silicon dioxide film are provided in succession from an outer peripheral side of an upper surface of the first element isolation region; and a second element isolation region having a second width that is larger than the first width, wherein a liner oxide film and a silicon dioxide film are provided in succession from an outer peripheral side of an upper surface of the second element isolation region.

22 Claims, 10 Drawing Sheets (51) Int. Cl.
*H01L 21/762* (2006.01)
*H01L 21/76* (2006.01)

(56) References Cited

U.S. PATENT DOCUMENTS

| | | | |
|---|---|---|---|
| 2004/0021197 A1 | 2/2004 | Oh et al. | |
| 2005/0121727 A1 | 6/2005 | Ishitsuka et al. | |
| 2006/0220144 A1 | 10/2006 | Anezaki et al. | |
| 2009/0256233 A1* | 10/2009 | Eun | 257/510 |

FOREIGN PATENT DOCUMENTS

| | | |
|---|---|---|
| CN | 1592969 A | 3/2005 |
| DE | 60124369 T2 | 10/2007 |
| DE | 60127799 T2 | 12/2007 |
| EP | 1211727 A2 | 6/2002 |
| EP | 1213757 A2 | 6/2002 |
| EP | 1487011 A1 | 12/2004 |
| JP | 2002-222855 A | 8/2002 |
| JP | 2002-231805 A | 8/2002 |
| JP | 2003-158241 A | 5/2003 |
| JP | 2006-286788 A | 10/2006 |
| JP | 2008-021675 A | 1/2008 |
| JP | 2010-109229 A | 5/2010 |
| JP | 2011-129771 A | 6/2011 |
| JP | 2012-231007 A | 11/2012 |
| KR | 10-2002-0043123 A | 6/2002 |
| KR | 10-2002-0045656 A | 6/2002 |
| TW | 247377 B | 5/1995 |
| TW | 527685 B | 4/2003 |
| TW | 567586 B | 12/2003 |
| WO | WO 03/046991 A1 | 6/2003 |

\* cited by examiner

Figure 1

Cell Array   S/A   SWD   Periphery

Low voltage    High voltage

SEMICONDUCTOR DEVICE AND METHOD FOR PRODUCING THE SAME

TECHNICAL FIELD

The present invention relates to a semiconductor device and a method for producing the same.

BACKGROUND ART

In a semiconductor device, an element isolation region is formed to demarcate an element-forming region. The element isolation region is formed by means of an STI (Shallow Trench Isolation) formed by filling a groove in a semiconductor layer with an insulating film. With regard to STIs, recent miniaturization has made it difficult for the STI groove to be filled with an insulating film using a CVD method or the like, and as measures to overcome this problem, methods have been proposed in which the groove is filled with a silicon dioxide film formed using an SOD (Spin On Dielectrics) method or a flowable-CVD method, with which a film can be formed by applying polysilazane or the like.

As described for example in patent literature article 1, the structure of the STI comprises a liner nitride film and an SOD film and/or an oxide film (HDP film) formed using a high-density plasma-CVD method (High Density Plasma-CVD: HDP-CVD). Further, patent literature article 1 describes the use of a structure having a liner nitride film and an SOD film for STIs having a small isolation width in a memory cell region, and the use of a structure having a liner nitride film, an SOD film and an HDP film for STIs having a large isolation width, provided in a region at the boundary between the memory cell region and a peripheral region.

Further, patent literature article 2 describes, as an STI, a structure having a wall oxide film and an element isolation oxide film, the element isolation oxide film comprising an SOD film and/or an HDP film. The literature also indicates that a liner nitride film and a liner oxide film are further provided between the wall oxide film and the element isolation oxide film. Further, patent literature article 3 describes a structure with which, when a flowable silazane compound is deposited using a flowable-CVD method into grooves having different isolation widths, in which a liner oxide film and a liner nitride film have been formed, grooves having a small isolation width are filled, while grooves having a large isolation width are not filled, and this literature article discloses a method in which grooves having a large isolation width are filled by forming an HDP-CVD oxide film after the silazane compound has been converted into an oxide film and has been densified.

PRIOR ART LITERATURE

Patent Literature

Patent literature article 1: Japanese Patent Kokai 2010-109229
Patent literature article 2: Japanese Patent Kokai 2011-129771
Patent literature article 3: Japanese Patent Kokai 2012-231007

SUMMARY OF THE INVENTION

Problems to be Resolved by the Invention

With regard to the structure of the STI, investigations have been carried out for a structure in which, in order to prevent oxidation of the walls in the trench and to prevent stresses due to such oxidation, a liner oxide film and a liner nitride film are provided inside the trench, and this is then filled using an oxide film. However, having diligently investigated this structure, the inventors found that it has the following problems.

In a DRAM there are locations such as sub-word drivers that are driven by means of a boosted voltage VPP, generated by internally boosting an external voltage VDD supplied from outside. In locations in which a high voltage such as the VPP is applied to the source/drain of a semiconductor element (transistor) in this way, in some cases electrons are trapped at the nitride film/oxide film interface in the vicinity of the STI surface, and the PMOS threshold voltage Vth drops, causing current failure.

With regard to this problem, the reduction in the transistor threshold can be prevented by increasing the thickness of the liner oxide film and moving the liner nitride film away from the surface of the STI trench, thereby reducing the number of electrons that are trapped. However, if the STIs in the memory cells are also formed using the same process, the data retention characteristics of the memory cells deteriorate, and there are also disadvantages in terms of cell miniaturization as the diffusion layer width is reduced.

Means of Overcoming the Problems

The invention according to one mode of embodiment of the present invention provides a semiconductor device comprising,
on one semiconductor substrate:
a first element isolation region having a first width, wherein a liner oxide film, a liner nitride film and a silicon dioxide film are provided in succession from an outer peripheral side of an upper surface of said first element isolation region; and
a second element isolation region having a second width that is larger than the abovementioned first width, wherein a liner oxide film and a silicon dioxide film are provided in succession from an outer peripheral side of an upper surface of said second element isolation region.

Further, the invention according to another mode of embodiment of the present invention provides a method of manufacturing a semiconductor device, comprising:
a step of forming on a semiconductor substrate a first groove having a first width and a second groove having a second width that is larger than the abovementioned first width;
a step of forming a liner oxide film and a liner nitride film on the inner walls of the abovementioned first and second grooves;
a step of forming a first silicon dioxide film such that it fills the abovementioned first groove but does not fill the abovementioned second groove;
a step of exposing the abovementioned liner nitride film in an upper portion side wall of the abovementioned second groove;
a step of removing the abovementioned liner nitride film that has been exposed in the abovementioned second groove;
a step of forming a second silicon dioxide film over the entire surface such that it fills the abovementioned second groove; and
a step of planarizing the entire surface as far as the surface of the abovementioned semiconductor substrate.

Advantages of the Invention

According to one mode of embodiment of the present invention, as a result of the liner nitride film not being provided, at least in the vicinity of the outer surface, in the wide second element isolation region for a semiconductor element to which a high voltage is applied, the problem of the threshold voltage decreasing as a result of electrons being trapped at the nitride film/oxide film interface is resolved, and as a result of the liner nitride film being present in the narrow first element isolation region for a semiconductor element to which a low voltage is applied, such as a memory cell, a deterioration in the data retention characteristics is suppressed.

MODES OF EMBODYING THE INVENTION

Exemplary embodiments of the present invention will now be described with reference to the drawings, but the present invention is not limited thereto.
Exemplary Embodiment 1
(Step in FIG. 1)

Figure 1:
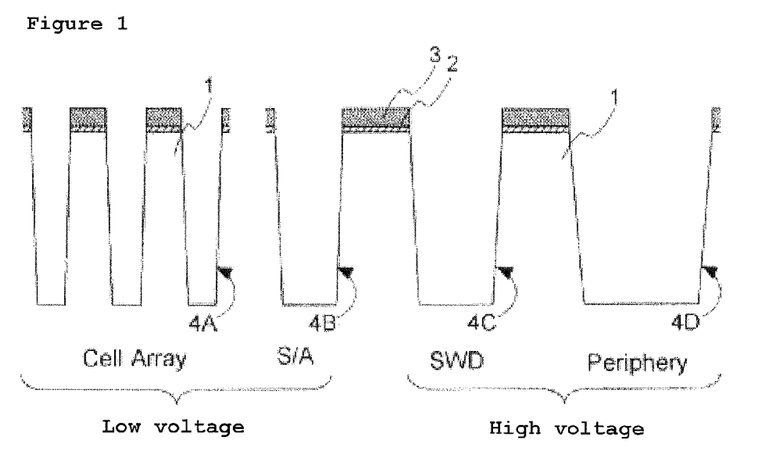
FIGS. 1 to 9 are process cross-sectional views used to describe the process for manufacturing a semiconductor device according to an exemplary embodiment of the present invention.

First, a pad oxide film 2 and a masking nitride film 3 are formed on a silicon substrate 1 serving as a semiconductor substrate, and after a photolithography step, the masking nitride film 3 and the pad oxide film 2 are patterned. The silicon substrate 1 is then etched using the masking nitride film 3 as a mask, to form STI trenches. Here, the STI trenches formed are STI trenches 4A in a memory cell array region, and, in a peripheral circuit region, an STI trench 4B for a low-voltage-driven semiconductor element such as a sense amplifier (S/A), an STI trench 4C for an element such as a sub-word driver (SWD) supplied with a high voltage such as the VPP, and an STI trench 4D for another peripheral circuit. The STI trench 4D signifies the trench having the largest isolation width, and here for convenience it is an STI trench for a high-voltage element, but it is not limited to this, and can accommodate any voltage. In terms of the isolation widths, 4A<4B<4C<4D. The STI trenches 4A having the smallest isolation width are formed to a width of at most 60 nm, and preferably a width of at most 45 nm.
(Step in FIG. 2)

Figure 2:
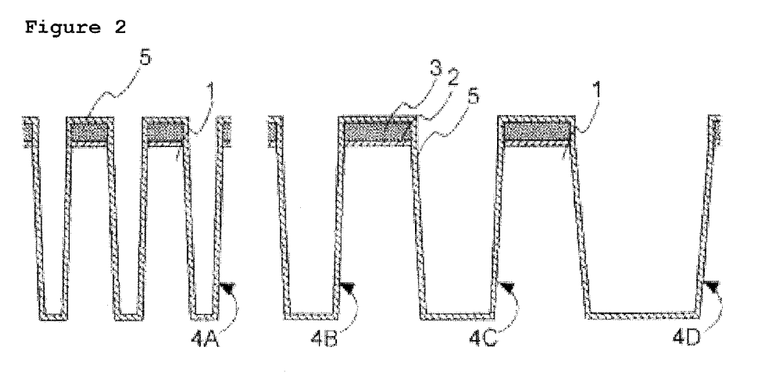

The surface of the silicon substrate 1 exposed in each trench is oxidized using an ISSG (in-situ steam generation) method or the like to form a liner oxide film 5. The liner oxide film 5 is formed to a film thickness of approximately 4 nm. At this time, the surface of the masking nitride film 3 is also oxidized. The thickness of the liner oxide film 5 is preferably at least 1 nm, and more preferably at least 2 nm. Further, the thickness of the liner oxide film 5 is preferably at most 8 nm, and more preferably at most 6 nm.
(Step in FIG. 3)

Figure 3:
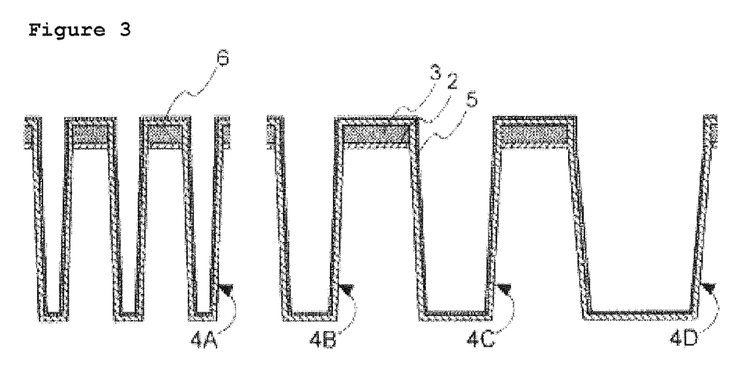

A liner nitride film 6 is formed using a CVD method or the like. The film thickness of the liner nitride film conforms to conventionally-known design criteria, without any particular restrictions.
(Step in FIG. 4)

Figure 4:
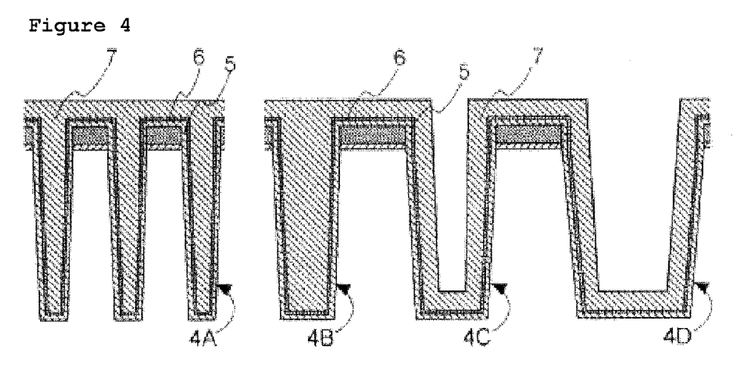

A first silicon dioxide film 7 is formed by applying for example a silica-based resin using a flowable-CVD method or an SOD (Spin On Dielectric) method. At this time, the STI trenches 4A and 4B are filled with the first silicon dioxide film 7, but the STI trenches 4C, 4D are not filled. Heat treatment is then performed in an oxidizing atmosphere to effect densification. The presence of the liner nitride film 6 prevents oxidation of the silicon substrate 1.
(Step in FIG. 5)

Figure 5:
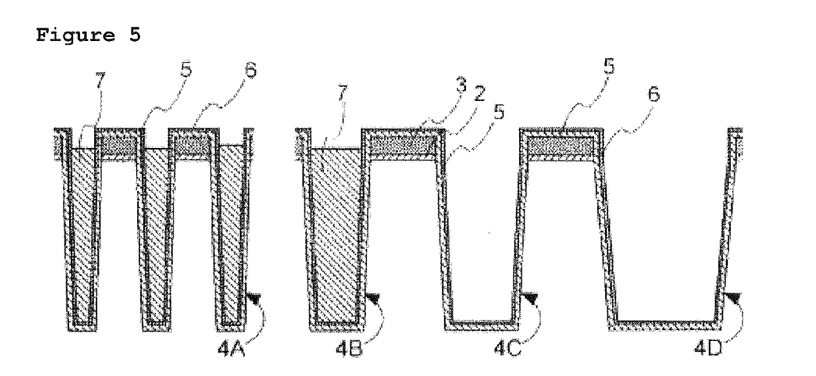

The first silicon dioxide film 7 is etched to expose the liner nitride film 6 on the masking nitride film 3. The etching is performed using isotropic etching such as wet etching, the duration being adjusted so as to allow the first silicon dioxide film 7 on the side wall sections of the STI trenches 4C and 4D to be removed. As a result, in the STI trenches 4C and 4D the first silicon dioxide film 7 which was formed on the inner walls is removed to expose the liner nitride film 6 on the inner walls of the trenches. It should be noted that in the STI trenches 4C and 4D, if the film thickness of the first silicon dioxide film 7 differs between the side wall sections and the groove bottom portions, for example if the film thickness of the groove bottom portion is greater, then it is not necessary for the first silicon dioxide film 7 in the groove bottom portion to be removed completely. The first silicon dioxide film 7 may be etched using dry etching. When this dry etching is performed, the exposed liner nitride film 6 may also be removed by continuing the dry etching. It is preferable to select highly isotropic conditions for the dry etching so that the depth to which the STI trenches 4A, 4B are etched is above the upper surface of the silicon substrate 1.
(Step in FIG. 6)

Figure 6:
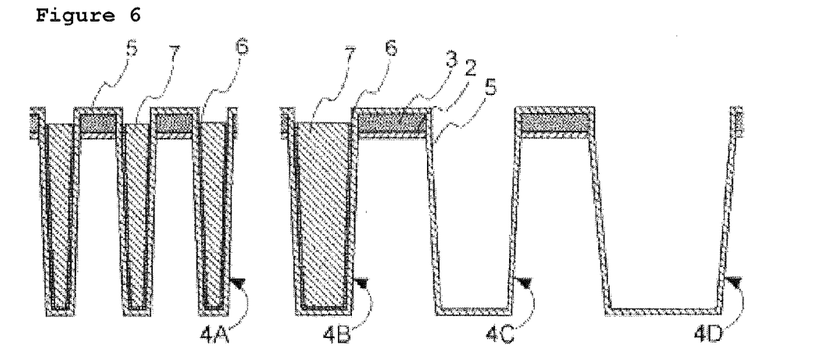

The exposed liner nitride film 6 is removed using heated phosphoric acid or the like. As a result, the liner oxide film 5 is exposed on the inner walls of the STI trenches 4C and 4D. Because the masking nitride film 3 is covered by the liner oxide film 5, it is not affected by the nitride film etching. If the first silicon dioxide film 7 remains in the groove bottom portions of the STI trenches 4C and 4D, then the liner nitride film 6 covered by the first silicon dioxide film 7 remains without being removed, but this is not a problem.
(Step in FIG. 7)

Figure 7:
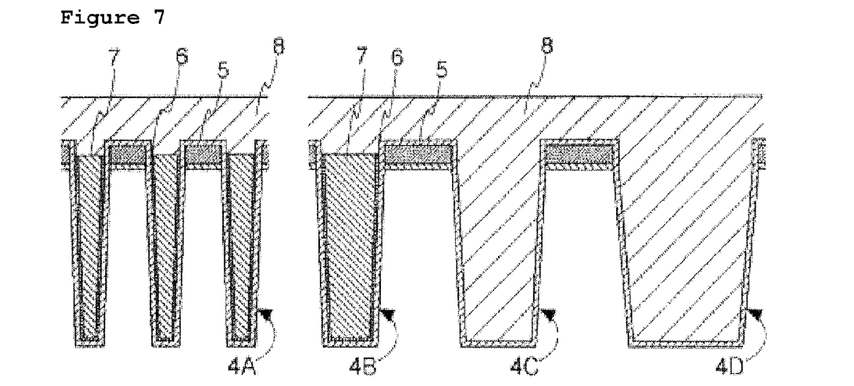

A second silicon dioxide film 8 is deposited over the entire surface by means of a high-density plasma-CVD method (HDP-CVD). With this HDP-CVD method, film deposition progresses while at the same time etching back of the underlying film occurs as a result of a sputtering effect generated by the high-density plasma. Thus if the liner nitride film 6 is sufficiently thin for it to be removed adequately by means of the sputtering effect, the step in FIG. 6 may be omitted and the exposed liner nitride film 6 may be removed at the same time as the second silicon dioxide film 8 is being deposited.
(Step in FIG. 8)

Figure 8:
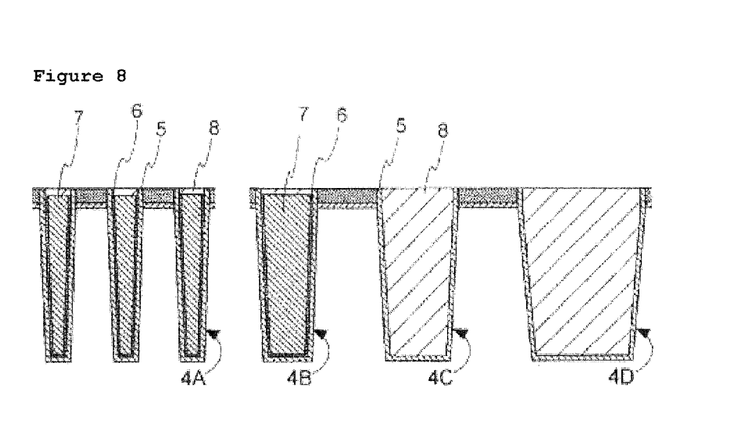

The second silicon dioxide film 8 is planarized using a chemical mechanical polishing (CMP) method, with the masking nitride film 3 serving as an etching stopper.

Figure 9:
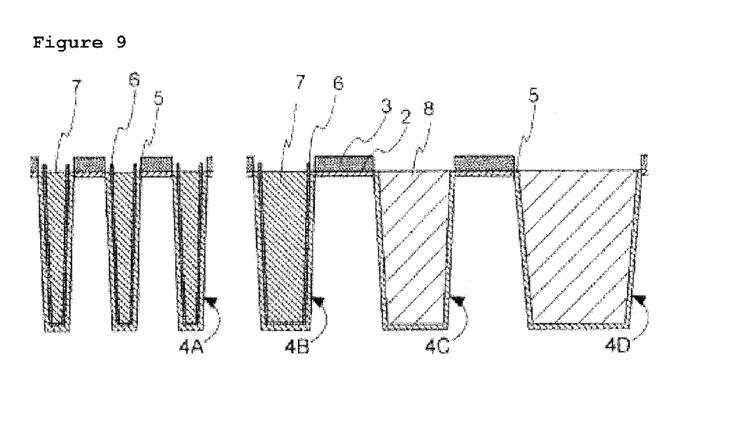

(Step in FIG. 9)

Further, oxide film etching is performed approximately as far as the bottom surface of the masking nitride film 3, to expose the first silicon dioxide film 7 in the STI trenches 4A, 4B.

Figure 10:
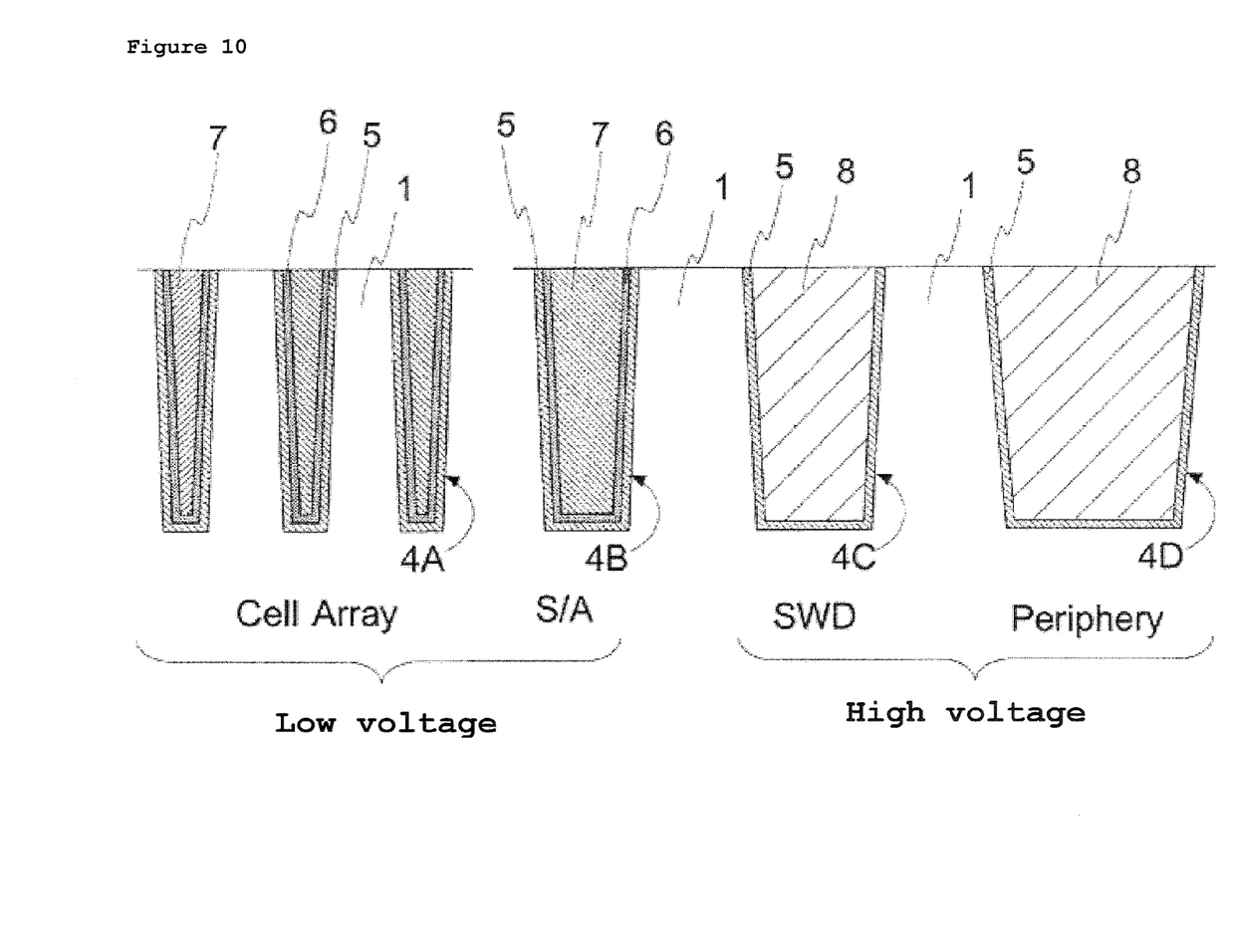
FIG. 10 is a cross-sectional view used to describe the element isolation region in the semiconductor device according to the exemplary embodiment of the present invention.

The exposed nitride films (the masking nitride film 3 and the liner nitride film 6) are then removed using heated phosphoric acid or the like, and then by etching back the oxide film to expose the surface of the silicon substrate 1, the STIs illustrated in FIG. 10 are formed. It should be noted that the surface of the silicon substrate 1 need not necessarily be exposed, and provided that the entire surface is planarized, the pad oxide film 2 may remain in place. In the STI trenches 4A and 4B are formed STIs on the surface of which the liner oxide film 5, the liner nitride film 6 and the first silicon dioxide film 7 are exposed, and in the STI trenches 4C and 4D are formed STIs on the surface of which the liner oxide film 5 and the second silicon dioxide film 8 are exposed. It should be noted that in the STI trenches 4A and 4B having a small isolation width, depending on the state of the etching of the first silicon dioxide film 7 in the step in FIG. 5, the second silicon dioxide film 8 may in some cases remain on the surface, and such cases are also within the scope of the present invention.

Figure 11:
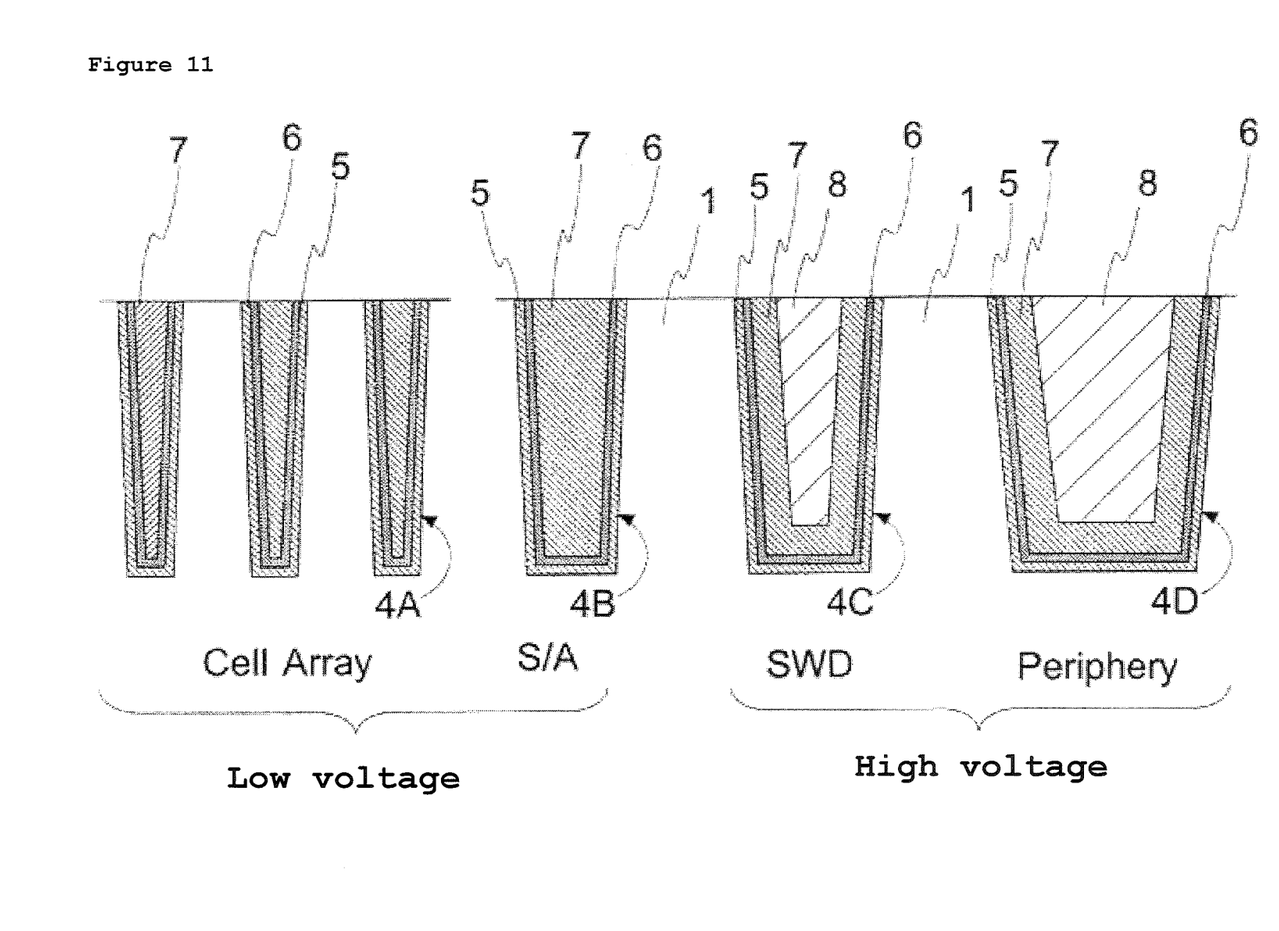
FIG. 11 is a cross-sectional view used to describe the element isolation region in a semiconductor device which serves as a comparative example devised by the inventors when devising the invention.

FIG. 11 is a drawing illustrating STIs in a comparative example devised by the inventors when devising the invention, the STIs being produced by forming the second silicon dioxide film 8 after the step in FIG. 4. In the example illustrated in FIG. 11, the STI trenches 4A and 4B are the same as in FIG. 10. However in the STI trenches 4C and 4D, the liner nitride film 6 and the first silicon dioxide film 7 are exposed at the surface. Further, in some cases the second silicon dioxide film 8 is formed following the step in FIG. 5, but the structure in the STI trenches 4C and 4D in those cases is also such that the liner nitride film 6 is exposed at the surface. Thus with the conventional structure, the structure is such that the liner nitride film 6 is exposed at the surface of the STIs for elements to which a high voltage is applied, and there is thus a concern that electrons may be trapped at the nitride film/oxide film interface, resulting in current failure due to a reduction in the threshold voltage of elements to which a high voltage is applied, in particular PMOS elements. In contrast, with the present invention the structure is such that the liner nitride film 6 is not present in the vicinity of the STI surface in the STI trench 4C for an SWD to which a high voltage is applied, and thus the current failure that occurs with the conventional structure as a result of a reduction in the threshold voltage does not occur.

Reference should be made for example to US Patent Application Publications US2011/0220968 and US2012/0120751 with regard to the relationships and the respective functions of memory cell arrays formed in memory cell array regions, peripheral circuits formed in peripheral circuit regions, sense amplifiers and sub-word drivers. Further, reference should also be made to the US publications mentioned above with regard to the voltage VARY supplied to memory cells, the voltage VPERI supplied to peripheral circuits, the voltage VDD supplied from outside, and the boosted voltage VPP. Further, reference should be made for example to U.S. Pat. No. 7,829,419 with regard to the planar layout of element isolation regions in memory cell array regions and peripheral circuit regions. Further, reference should be made for example to U.S. Pat. No. 7,842,976 with regard to the planar layout of sense amplifier forming regions containing element isolation regions. Further, reference should be made for example to U.S. Pat. No. 8,130,546 with regard to the planar layout of sub-word driver forming regions containing element isolation regions.

Exemplary Embodiment 2

In exemplary embodiment 1, the first silicon dioxide film 7 in the upper portions of the STI trenches 4A, 4B having small isolation widths is also removed when the first silicon dioxide film 7 in the STI trenches 4C, 4D having large isolation widths is removed by etching. At this time, the first silicon dioxide film 7 sometimes recedes to below the upper surface of the silicon substrate 1. The second silicon dioxide film 8 can be used for refilling, but as miniaturization progresses, the filling properties of the second silicon dioxide film 8 deteriorate, and it is possible, in particular with the STI trenches 4A of memory cell portions having a small isolation width, that problems may arise such as the formation of voids, adversely affecting the manufacture of the memory cell portions. In this exemplary embodiment a description will be given of a method for removing the liner nitride film 6 in the upper portions of the STI trenches 4C, 4D while, as far as possible, not etching the first silicon dioxide film 7.

The steps in FIG. 1 to FIG. 3 are performed in the same way as in exemplary embodiment 1, as far as the formation of the liner nitride film 6.

Figure 12:
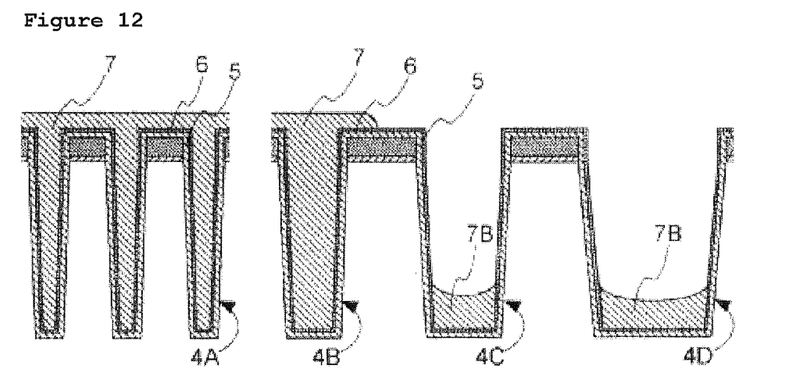
FIGS. 12 to 16 are process cross-sectional views used to describe the process for manufacturing a semiconductor device according to another exemplary embodiment of the present invention.

(Step in FIG. 12)

The first silicon dioxide film 7 is deposited using a flowable-CVD method. Here, the flowability is adjusted so that first silicon dioxide film 7 flows down into the bottom portions of the STI trenches 4C, 4D to form a bottom silicon dioxide film 7B. The wettability between the surface of the liner nitride film 6 and a film deposited using a flowable-CVD method is low, and if the flowability is sufficiently high, the deposited film does not attach to the side surface sections in the upper portions of the STI trenches 4C, 4D, and the liner nitride film 6 is exposed. It should be noted that FIG. 12 illustrates a situation in which the first silicon dioxide film 7 is not formed on the masking nitride film 3 between the STI trenches 4C, 4D, but if the distance between the STI trenches 4C, 4D is large, the first silicon dioxide film 7 may in some cases remain on the masking nitride film 3. If the flowability is not sufficiently high and the first silicon dioxide film 7 attaches thinly to the upper portions of the STI trenches 4C, 4D, then the first silicon dioxide film 7 is removed by etching, in the same way as in exemplary embodiment 1, but because the amount to be etched is small, it is possible to leave an adequate amount of the first silicon dioxide film 7 in the upper portions of the STI trenches 4A, 4B. Patent literature article 3 for example sets forth in detail the steps for using a flowable-CVD method to fill a groove having a small isolation width while allowing the film to flow down into the bottom portion of a groove having a large isolation width, and reference should be made thereto. It should be noted that the flowable-CVD method in the present invention includes both a method in which a silicon dioxide film is deposited using a CVD method employing TEOS or the like as a starting material, after which flowability is imparted by thermal reflow, and a method in which, as set forth in the prior art and in the invention in patent literature article 3, a CVD method is used to deposit a film in the form of a flowable silicon compound such as silanol or silazane, after which the film is converted to silicon dioxide and is densified. In particular in the present exemplary embodiment a method may preferably be employed in which the film is deposited in the form of a flowable silicon compound.

Figure 13:
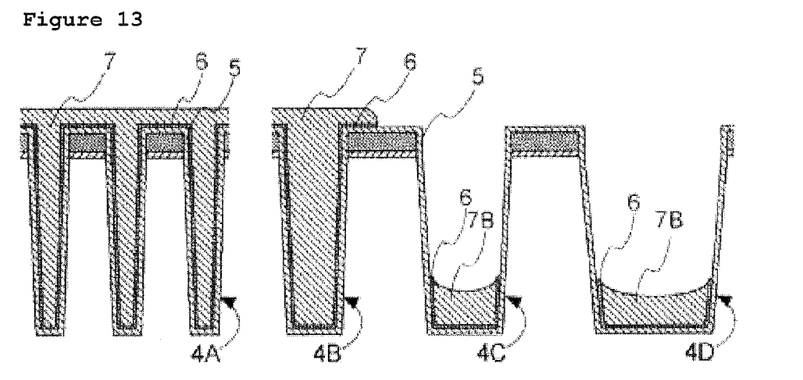

(Step in FIG. 13)

The exposed liner nitride film 6 is removed by dry etching or by wet etching using heated phosphoric acid or the like. As a result, the liner oxide film 5 is exposed on the inner walls in the upper portions of the STI trenches 4C and 4D. Because the masking nitride film 3 is covered by the liner oxide film 5, it is not affected by the nitride film etching. The bottom silicon dioxide film 7B remains in the groove bottom portions of the STI trenches 4C and 4D, and therefore the liner nitride film 6 remains without being removed.

Figure 14:
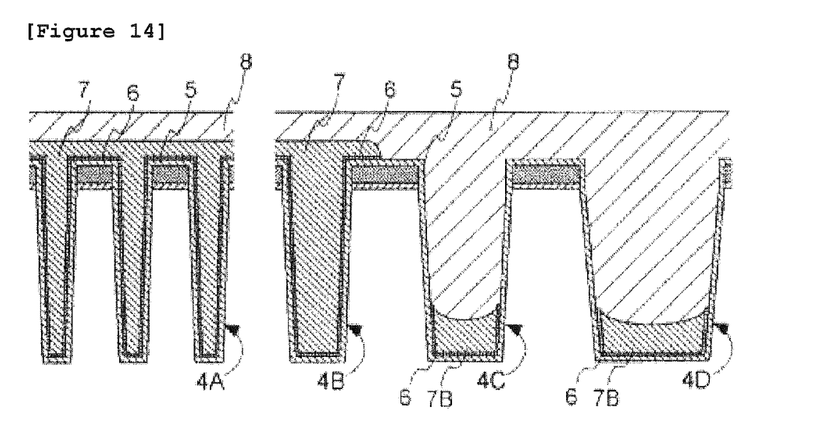

(Step in FIG. 14)

The second silicon dioxide film 8 is deposited over the entire surface using an HDP-CVD method. As described in exemplary embodiment 1, if the liner nitride film 6 is sufficiently thin, the step in FIG. 13 may be omitted and the liner nitride film 6 may be removed at the same time as the second silicon dioxide film 8 is being deposited.

Figure 15:
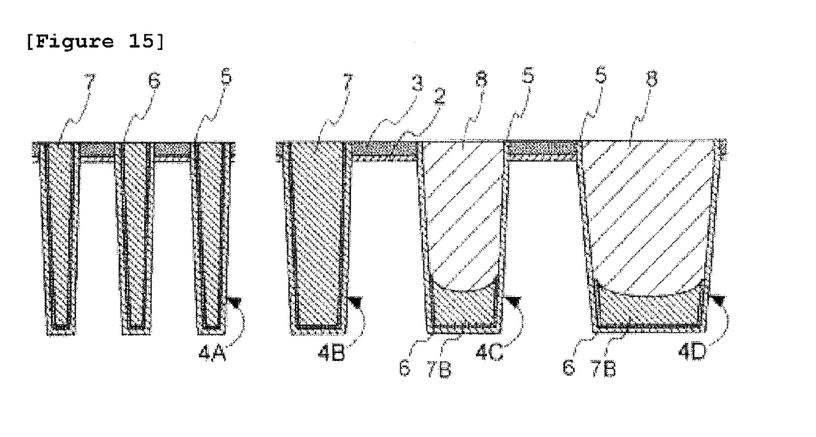

(Step in FIG. 15)

With the masking nitride film 3 serving as an etching stopper, a CMP method is used to remove the second silicon dioxide film 8, the first silicon dioxide film 7, the liner nitride film 6 and the liner oxide film 5, and planarization is carried out.

Figure 16:
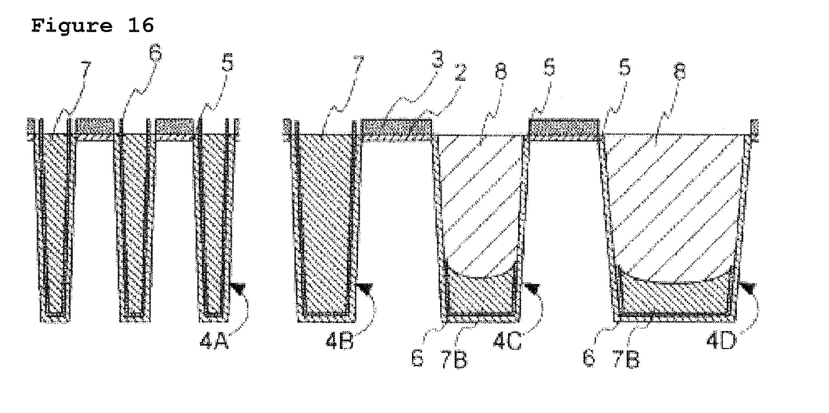

(Step in FIG. 16)

Further, oxide film etching is performed approximately as far as the bottom surface of the masking nitride film 3.

Figure 17:
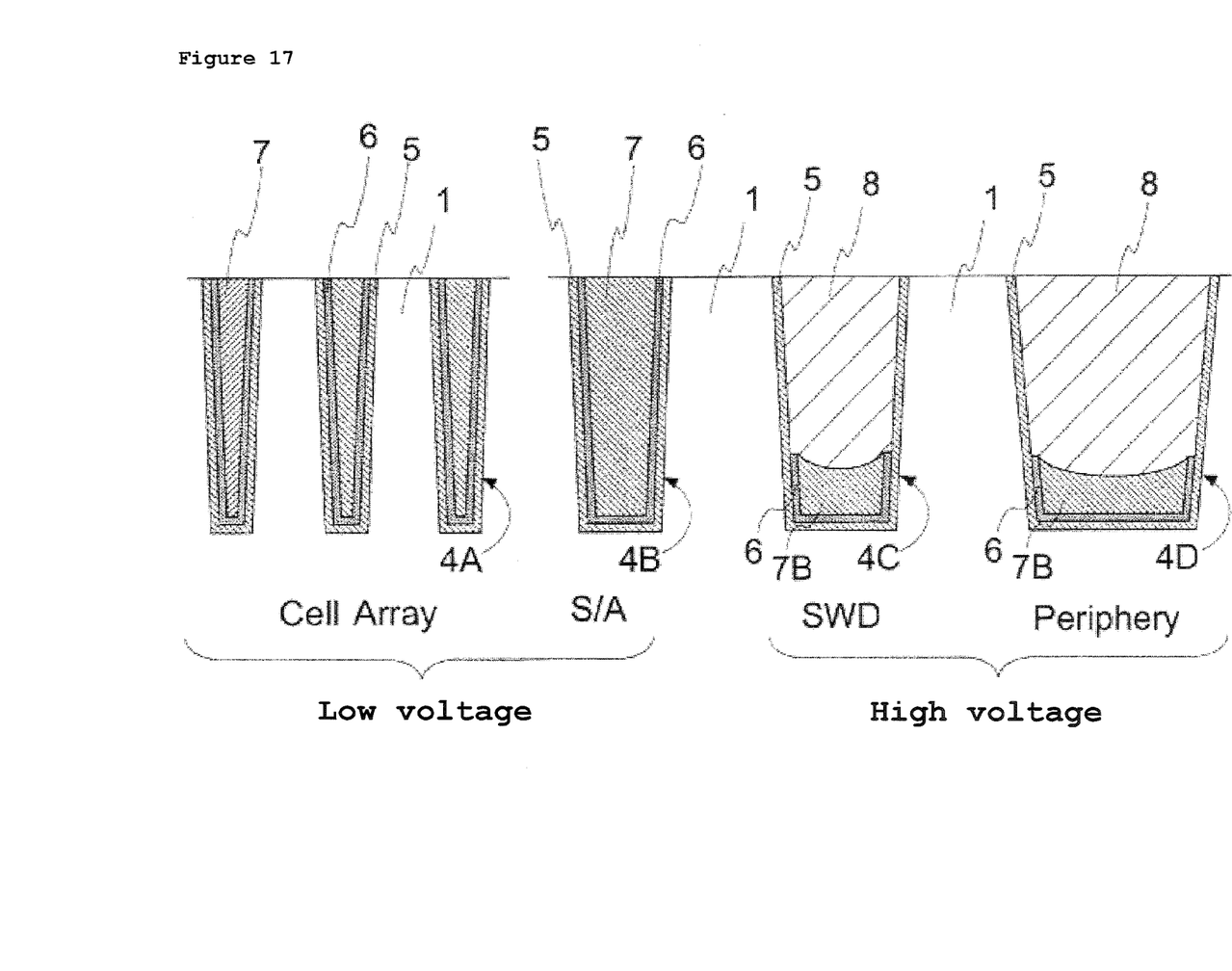
FIG. 17 is a cross-sectional view used to describe the element isolation region in the semiconductor device according to the other exemplary embodiment of the present invention.

The exposed nitride films (the masking nitride film 3 and the liner nitride film 6) are then removed using heated phosphoric acid or the like, and then the STIs illustrated in FIG. 17 are formed by etching back the oxide film to expose the surface of the silicon substrate 1. In the STI trenches 4A and 4B are formed STIs at the surface of which the liner oxide film 5, the the liner nitride film 6 and the first silicon dioxide film 7 are exposed, and in the STI trenches 4C and 4D are formed STIs in the bottom portion of which the liner oxide film 5, the liner nitride film 6 and the first silicon dioxide film 7 (the bottom silicon dioxide film 7B) are present, and at the surface of which the liner oxide film 5 and the second silicon dioxide film 8 are exposed.

Thus with the present exemplary embodiment the structure is such that the liner nitride film 6 is not present in the vicinity of the STI surface in the STI trench 4C for an SWD to which a high voltage is applied, and therefore the current failure that occurs with the conventional structure as a result of a reduction in the threshold voltage does not occur.

Further, it is essentially unnecessary for the first silicon dioxide film 7 to be removed when the liner nitride film 6 is removed, and therefore fine element isolation regions can be achieved at the same time.

EXPLANATION OF THE REFERENCE NUMBERS

1 Silicon substrate
2 Pad oxide film
3 Masking nitride film
4A to 4D STI trench
5 Liner oxide film
6 Liner nitride film
7 First silicon dioxide film
7B Bottom silicon dioxide film
8 Second silicon dioxide film

The invention claimed is:

1. A semiconductor device comprising, on one semiconductor substrate:
   a first element isolation region having a first width, wherein a liner oxide film, a liner nitride film and a silicon dioxide film are provided in succession from an outer peripheral side of an upper surface of said first element isolation region; and
   a second element isolation region having a second width that is larger than the first width, wherein a liner oxide film and a silicon dioxide film are provided in succession from an outer peripheral side of an upper surface of said second element isolation region,
   the silicon dioxide film provided on the upper surface of the first element isolation region comprises a first silicon dioxide film, and the silicon dioxide film provided on the upper surface of the second element isolation region comprises a second silicon dioxide film that is different from the first silicon dioxide film,
   the second element isolation region is formed in a groove on an inner wall of which the liner oxide film has been formed, and
   the first silicon dioxide film is contained in a bottom portion of said groove.

2. The semiconductor device as claimed in claim 1, wherein the oxide film has a film thickness in a range of 1 to 8 nm.

3. The semiconductor device as claimed in claim 1, wherein the second element isolation region for a semiconductor element to which a voltage is applied that is higher than that applied to a semiconductor element provided with the first element isolation region.

4. The semiconductor device as claimed in claim 1, wherein the semiconductor device includes a memory cell region, and the first element isolation region is formed in the memory cell region.

5. The semiconductor device as claimed in claim 1, wherein the semiconductor device includes a peripheral circuit region, and the second element isolation region is formed in the peripheral circuit region.

6. The semiconductor device as claimed in claim 1, wherein the semiconductor device includes a sense array forming region, and the first element isolation region is formed in the abovementioned sense array forming region.

7. The semiconductor device as claimed in claim 1, wherein the semiconductor device includes a sub-word driver forming region, and the second element isolation region is formed in the sub-word driver forming region.

8. The semiconductor device as claimed in claim 1, wherein the second element isolation region contains a liner nitride film between the first silicon dioxide film in the bottom portion of the groove and the liner oxide film.

9. The semiconductor device as claimed in claim 1, wherein the second silicon dioxide film in the second element isolation region is disposed above and in contact with the first silicon dioxide film.

10. A method of manufacturing a semiconductor device, comprising:
    forming on a semiconductor substrate a first groove having a first width and a second groove having a second width that is larger than the first width;
    forming a liner oxide film and a liner nitride film on inner walls of the first and second grooves;
    forming a first silicon dioxide film such that the said first silicon dioxide film fills the first groove but does not fill the second groove;
    exposing the liner nitride film in an upper portion side wall of the second groove;
    removing the liner nitride film that has been exposed in the second groove;
    forming a second silicon dioxide film over an entire surface such that the second silicon dioxide film fills the second groove; and
    planarizing the entire surface as far as a surface of the semiconductor substrate.

11. The method of manufacturing a semiconductor device as claimed in claim 10, wherein the liner oxide film is formed by thermally oxidizing semiconductor layers exposed in the first and second grooves.

12. The method of manufacturing a semiconductor device as claimed in claim 10, wherein the liner oxide film is formed to a film thickness in a range of 1 to 8 nm.

13. The method of manufacturing a semiconductor device as claimed in claim 10, wherein the first silicon dioxide film is formed using a flowable-chemical vapor deposition (CVD) method or a spin on dielectrics (SOD) method.

14. The method of manufacturing a semiconductor device as claimed in claim 13, wherein the first silicon dioxide film is formed using a flowable-CVD method which is performed by adjusting a flowability such that the silicon dioxide film fills the first groove but does not attach to upper portion side walls of the second groove, thereby causing the liner nitride film to be exposed.

15. The method of manufacturing a semiconductor device as claimed in claim 10, wherein the first silicon dioxide film is formed covering the liner nitride film, and the exposing the liner nitride film in the upper portion side wall of the second groove is carried out by isotropically etching the first silicon dioxide film.

16. The method of manufacturing a semiconductor device as claimed in claim 15, wherein the exposing the liner nitride film in the upper portion side wall of the second groove includes exposing all of the liner nitride film in the second groove.

17. The method of manufacturing a semiconductor device as claimed in claim 15, wherein the isotropic etching of the first silicon dioxide film includes leaving the first silicon dioxide film in a bottom portion of the second groove.

18. The method of manufacturing a semiconductor device as claimed in claim 17, wherein the forming the first silicon dioxide film includes forming the first silicon dioxide film such that a film thickness of the first silicon dioxide film in the bottom portion of the second groove is greater than a film thickness of the first silicon dioxide film on the side wall portions of the second groove.

19. The method of manufacturing a semiconductor device as claimed in claim 17, wherein the removing the liner nitride film includes leaving the liner nitride film in the bottom portion of the second groove and removing the liner nitride film in the upper portion of the second groove.

20. The method of manufacturing a semiconductor device as claimed in claim 19, wherein the removing of the liner nitride film in the second groove is performed consecutively to the etching of the first silicon dioxide film.

21. The method of manufacturing a semiconductor device as claimed in claim 10, wherein the second silicon dioxide film using a high-density plasma-CVD method.

22. The method of manufacturing a semiconductor device as claimed in claim 21, wherein the removing the liner nitride film and the forming a second silicon dioxide film over the entire surface such that the second silicon dioxide film fills the second groove include using the high-density plasma-CVD method to form the second silicon dioxide film while removing the liner nitride film exposed in the second groove.

* * * * *